United States Patent [19]

Yamanishi et al.

[11] Patent Number: 5,366,814
[45] Date of Patent: Nov. 22, 1994

[54] COPPER FOIL FOR PRINTED CIRCUITS AND PROCESS FOR PRODUCING THE SAME

[75] Inventors: Keisuke Yamanishi; Hideo Oshima; Kazuhiko Sakaguchi, all of Hitachi, Japan

[73] Assignee: Nikko Gould Foil Co., Ltd., Tokyo, Japan

[21] Appl. No.: 153,327

[22] Filed: Nov. 16, 1993

[30] Foreign Application Priority Data

Nov. 19, 1992 [JP] Japan .................. 4-332220

[51] Int. Cl.⁵ .................. B32B 15/20; H05K 1/09; C25D 7/06
[52] U.S. Cl. .................. 428/607; 428/612; 428/675; 428/687; 428/435; 205/111; 205/182; 205/239
[58] Field of Search .................. 428/675, 607, 612, 626, 428/687, 935, 632, 658, 676; 205/111, 182, 239

[56] References Cited

U.S. PATENT DOCUMENTS

Re. 30,180 12/1979 Wolski et al. .................. 428/675
4,619,871 10/1986 Takami .................. 428/607

FOREIGN PATENT DOCUMENTS 48-33503 10/1973 Japan .
54-38053 11/1979 Japan .
57-184295 11/1982 Japan .
57-193095 11/1982 Japan .
153634 1/1963 U.S.S.R. .................. 205/239

Primary Examiner—John Zimmerman
Attorney, Agent, or Firm—Seidel, Gonda, Lavorgna & Monaco

[57] ABSTRACT

A copper foil for printed circuits has a roughened layer formed on the side of the foil to be bonded to a base, the roughened layer consisting of a number of protuberant copper electrodeposits containing chromium tungsten or both. It may also have a copper plating layer covering the roughened layer and a treatment layer covering the copper plating layer and formed of either a metal selected from the group consisting of copper, chromium, nickel, iron, cobalt, and zinc, or an alloy of two or more such metals. When necessary, the copper foil may contain an anticorrosive layer including various chromate treated layers further formed on the treatment layer. The copper foil is produced by electrolyzing a raw foil as a cathode in an acidic copper electrolytic bath at a current density close to the critical density, thereby forming the roughened layer, the electrolytic bath containing 0.001-5 g/l of chromium ion tungsten ion or both. The roughened layer is electrolytically overcoated with the treatment layer following the formation of a copper plating layer, which, when necessary, is anti-corrosively treated.

14 Claims, 4 Drawing Sheets

FIG.2

COPPER FOIL FOR PRINTED CIRCUITS AND PROCESS FOR PRODUCING THE SAME

FIELD OF THE INVENTION

This invention relates to a copper foil for printed circuits and a process for producing the foil, and more particularly to a copper foil for printed circuits the surface of which to be bonded to a resin base is provided with a layer of copper electrodeposits in the form of numerous small protuberant (granular or nodular or knobby, hereinafter called "protuberant") deposits containing chromium, tungsten or both to increase the strength of bond between the foil and the resin base. The invention relates also to a process for producing such a foil.

BACKGROUND OF THE INVENTION

Copper foil for printed circuits generally is laminated and bonded to the base of a synthetic resin or the like at high temperature and high pressure, screen printed with necessary circuit patterns using a resist to form objective circuits, and then is etched with an etchant such as a cupric chloride solution to remove unwanted portions. Finally, desired elements are soldered in place, and in this way various printed circuit boards for electronic devices are fabricated. Qualitative requirements for the copper foil for printed wiring boards differ depending on the side of the foil, namely the matted side to be bonded to the resin base and the opposite, shiny side.

Requirements for the matte side to which the present invention pertains may be boiled down to:

(1) Adequate resistance to peeling from the base even after high-temperature heating, wet treatment, soldering, chemical treatment or the like (peel strength);

(2) No possibility of oxidative discoloration during storage (corrosion preventiveness);

(3) Freedom from so-called lamination spots that can be observed after lamination to the base followed by etching (hydrochloric acid resistance); and (4) No dusting after etching (prevention of dusting).

Of these requirements, a sufficiently high peel strength is the most imperative for the surface to be bonded to a base.

To enhance the bond strength between the copper foil and the resin base, a roughening-treated layer consisting of numerous small protuberant copper electrodeposits is formed on the surface of the copper foil, particularly a rolled copper foil, to be bonded to a base. For the roughening of an electrolytic copper foil, which already has uneven surface with knurls produced in the electrolytic course, many protuberant copper electrodeposits are formed on and around the tops of the individual knurls to increase and reinforce them.

An effective roughening treatment for electrolytic copper foils is disclosed in the literature including Japanese Patent Application Publication Nos. 38053/1979 and 39327/1978 etc. It involves electrolysis in an acidic copper electrolytic bath containing arsenic, antimony, bismuth, selenium, or tellurium at about critical current density. Practically, arsenic acid is often added to the electrolytic bath. In this way, a number of protuberant copper electrodeposits are formed on and around the individual knurls of the raw electrolytic foil, thus effectively further roughening the surface for greater bonding strength.

In the case where arsenic takes part in the electrolysis, several hundreds of parts of arsenic per million is mixed into the electrodeposits. This poses a serious environmental or health problem when the copper foil thus treated is recycled or otherwise exploited or when an etching solution in which arsenic has dissolved out is disposed of.

Methods aimed at roughening without employing such a toxic element have hitherto been proposed. Among them are the use of a bath containing a trace amount of a benzoquinoline (Pat. App. Pub. No. 41196/1981), treatment with a bath containing molybdenum, vanadium or both (Pat. App. Pub. Nos. 56677/1987 and 56678/1987), and pulse plating (Pat. App. Public Disclosure Nos. 17597/1988 and 164797/1983). None of those methods have proved fully satisfactory yet in respect of the peel strength, dusting or other properties of the treated surfaces.

OBJECT OF THE INVENTION

The object of the present invention is to establish a technique of roughening the surface of a copper foil for printed circuits to be bonded to a resin base so as to produce an adequate bond strength between the foil and the base, and to cause no dusting or other problems in subsequent etching, without presenting any environmental problem.

SUMMARY OF THE INVENTION

After research for the realization of the object of the invention, it has now been found that a roughened layer of numerous protuberant copper electrodeposits on the side of a copper foil to be bonded to a base can be formed by using a copper electrolytic bath containing chromium ion tungsten ions or both. The formation of electrodeposits from such a bath improves the bond strength between the copper foil and a resin base because it inhibits the growth of dendrites (crystals of a treelike structure). Thus, the rounded protuberances are favorably electrodeposited from the bath. On the basis of this discovery, the present invention provides a copper foil for printed circuits characterized in that the side of the foil to be bonded to a base has a roughened layer formed thereon which consists of a number of protuberant copper electrodeposits containing chromium, tungsten or both.

The roughened layer may be overcoated with treatment layers as heretofore known. From this viewpoint, the invention provides: a copper foil for printed circuits characterized in that the side of the foil to be bonded to a base has (a) a roughened layer formed thereon which consists of a number of protuberant copper electrodeposits containing chromium, tungsten or both, (b) a copper plating layer covering said roughened layer and (c) a treatment layer(s) covering said copper plating layer, said treatment layer being formed of either a metal selected from the group consisting of copper, chromium, nickel iron, cobalt, and zinc, or an alloy of two or more such metals. The invention further provides a copper foil for printed circuits characterized in that the side of the foil to be bonded to a base has (a) a roughened layer formed thereon which consists of a number of protuberant copper electrodeposits containing chromium ion tungsten ion or both, (b) a copper plating layer covering said roughened layer, (c) a treatment layer(s) covering said copper plating layer, said treatment layer being formed of either a metal selected from the group consisting of copper, chromium, nickel, iron, cobalt, and zinc, or an alloy of two or more such metals, and (d) an anticorrosive layer further coating said treatment layer.

Further, for the manufacture of a copper foil for printed circuits, the invention provides: a process for producing a copper foil for printed circuits by electrolyzing a copper foil as a cathode in an acidic copper electrolytic bath at a current density close to the critical, thereby forming a roughened layer consisting of a number of protuberant copper electrodeposits on the side of the copper foil to be bonded to a base, characterized in that the electrolytic bath contains from 0.001 to 5 grams per liter of chromium ion tungsten ion or both. Furthermore, the invention provides the process defined as above, further characterized in that the roughened layer is coated with a copper plating layer and the copper plating layer is electrolytically overcoated with a treatment layer(s) formed of either a metal selected from the group consisting of copper, chromium, nickel, iron, cobalt, and zinc, or an alloy of two or more such metals, and, in case of the necessity, the treatment layer in turn is anticorrosively treated.

DETAILED DESCRIPTION OF THE INVENTION

According to this invention, a roughened layer is formed on a copper foil in an acidic copper electrolytic bath wherein chromium and/or tungsten ions are allowed to be present in an amount of 0.001-5 g/l, and protuberant copper electrodeposits of the roughened layer contain a trace amount of chromium and/or tungsten. This controls nuclear growth and inhibits the formation of dendrites at the time of copper electrodeposition. Moreover, the electrodeposited protuberances are rounded to help increase the strength of the bond formed between the copper foil and the base and to avoid dusting of the foil during etching. Without the presence of chromium ion or tungsten ion in the electrolytic bath, electrolysis at a current density around the critical level would form dendritic copper deposits that could impair rather than enhance the bonding strength. Dusting during etching leaves fine copper particles behind which could injure the electrical characteristics of the foil.

The present invention is applicable to both rolled and electrolytic copper foils, especially to the latter. The invention is useful in individually reinforcing a number of protrusions or knurls originally present on electrolytic copper foils. It is true that such a roughened layer is effectively formed by conventional electrolysis performed at around the critical current density by the use of a copper electrolytic bath containing a toxic element, typified by arsenic. However, the arsenic mixed into the roughened layer at a concentration of several hundred parts per million has posed environmental and health problems.

Figure 1:
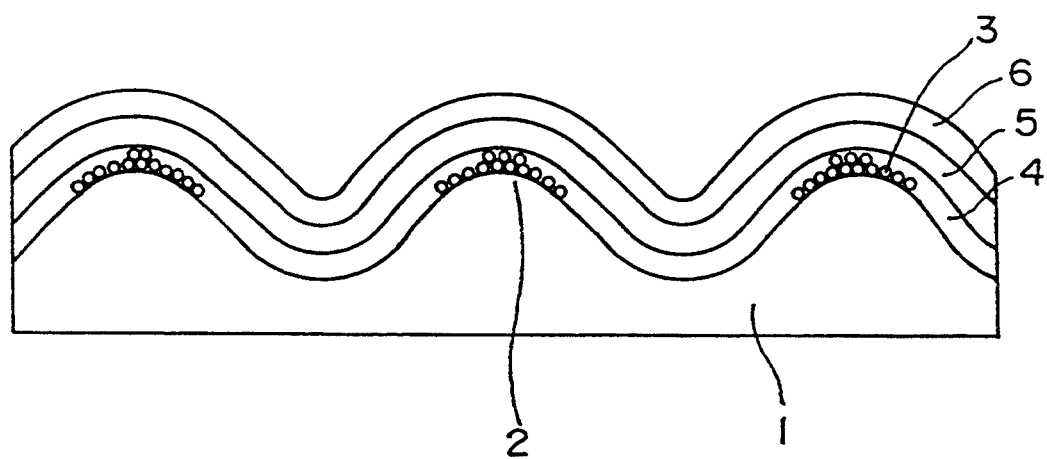
FIG. 1 is a schematic sectional view of a typical laminate of treatment layers formed on the side of an electrolytic copper foil to be bonded to a base.

There is shown in FIG. 1 a typical laminate of treatment layers formed on the side of an electrolytic copper foil to be bonded to a base. Being an electrolytic copper foil, the raw foil 1 has knurls 2 distributed over the entire surface to be bonded to a base. This raw foil surface is further roughened. The roughening in accordance with the invention reinforces the knurls 2 by forming a roughening layer 3 on and around the individual knurls. The roughening layer 3 consists of a number of protuberant copper electrodeposits containing chromium, tungsten or both and formed mainly on and around the top of each knurl. With a flat copper foil such as a rolled one, the copper electrodeposits themselves directly form the protuberances. Then varied treatment procedures may be conducted on the copper foil. For example, a thin copper plating layer 4 is formed to keep the protuberant copper electrodeposits from falling off. To impart heat resistance or other properties, it is overlaid with a treatment layer 5 of a metal such as copper, chromium, nickel, iron, cobalt, or zinc, or of an alloy such as brass. Lastly, an anticorrosive layer 6, typified by a chromate film, is formed. The copper foil thus treated on the surface is bonded to a resin base or the like. The sequence of process steps will now be described in detail.

The plating conditions with a copper electrolytic bath for roughening in conformity with the invention are as follows:

| | |
|---|---|
| Cu ion | 5–50 g/l |
| $H_2SO_4$ | 10–100 g/l |
| Cr or W ion | 0.001–5 g/l |
| Temperature | room temp.—50° C. |
| $D_k$ | 5–80 A/dm$^2$ |
| Time | 1–30 sec. |

The concentration of chromium ion tungsten ion or of their combination to be present in the copper electrolytic bath suitably ranges from 0.001 to 5 g per liter, preferably from 0.01 to 1 g per liter. An addition of less than 0.001 g/l is not adequately effective in increasing the bonding strength. Any addition in excess of 5 g/l does not bring a noticeable improvement in the effect but adds to the economic burden. As the source for supplying chromium or tungsten, a sodium salt, potassium salt, oxide or the like may be employed. Typically, chromic anhydride (VI) or sodium tungstate (dihydrate) is used.

After the roughening treatment, it is desirable that the roughened surface be coated with a thin copper plating layer and then be so treated as to form a metal layer or alloy layer of one or more metals selected from the group consisting of copper, chromium, nickel, iron, cobalt, and zinc. For instance, according to a known process as disclosed in patent application publication No. 56677/1987, a thin copper layer may be formed to cover the protuberant copper electrodeposits of the roughened layer to keep the copper electrodeposits from falling off. The copper layer, in turn, may be overcoated with either a metal layer of copper, chromium, nickel, iron, cobalt, or zinc or a layer of alloy typified by copper-nickel, copper-cobalt, copper-nickel-cobalt, copper-zinc, etc. (Refer to Pat. App. Pub. No. 9028/1981, Pat. App. Public Disclosure Nos. 13971/1979, 292894/1990, and 292895/1990, and Pat. App. Pub. Nos. 35711/1976 and 6701/1979.). Such treatment layers determine the ultimate properties of the copper foil and also serve as barriers for the foil.

By way of example, a zinc film may be formed by either zinc electroplating or electroless plating. However, where the film is to be formed only on one side of a zinc sheet, i.e., on the roughened side, a zinc electrolytic operation is more convenient. Electrolysis is preferred too because it permits precise thickness control and ensure uniformity of thickness and densification of the deposited layer. Zinc electrolytic operation may use an acidic zinc plating bath typified by zinc sulfate or zinc chloride plating bath, an alkaline zinc plating bath such as zinc cyanide plating bath, or a zinc pyrophosphate plating bath. A zinc sulfate bath, the most commonly used bath, is adequate for the present invention. With a zinc sulfate bath, the most desirable conditions for zinc electrolysis are as follows:

| $ZnSO_4 \cdot 7H_2O$ | 50–350 g/l |
|---|---|
| pH (sulfuric acid) | 2.5–4.5 |
| Bath temperature | 40–60° C. |
| Cathode | copper foil |
| Anode | zinc or insoluble anode |
| Cathode current density | 0.05–0.4 A/dm$^2$ |
| Time | 10–30 sec. |

The amount of zinc coating is desirably in the range of 15–1500 μg/dm$^2$, more desirably in the range of 15–400 μg/dm$^2$. The amount varies with the type of the resin base for the lamination. For example, the amount for a phenol resin base is 15–60 μg/dm$^2$ and that for a glass-epoxy resin base is 60–1500 μg/dm$^2$, preferably 60–400 μg/dm$^2$.

Taking the case of treatment with a Cu—Zn alloy as an exemplary alloy, the conditions as well as the electrolyte composition for the treatment are given below:

| NaCN | 10–30 g/l |
|---|---|
| NaOH | 40–100 g/l |
| CuCN | 60–120 g/l |
| Zn(CN)$_2$ | 1–10 g/l |
| pH | 10–13 |
| Temperature | 60–80° C. |
| D$_k$ | 1–10 A/dm$^2$ |

Further, desirably, this treatment layer is overcoated with an anticorrosive layer. Any desirable one of known anticorrosive treatments is applicable. A chromate treating solution may be chosen from among various ones currently in use. Exemplary desirable conditions for the chromate treatment are as follows:

| K$_2$Cr$_2$O$_7$ (or Na$_2$Cr$_2$O$_7$, CrO$_3$) | 0.2–20 g/l |
|---|---|
| Acid | phosphoric acid, sulfuric acid or an organic acid |
| pH | 1.0–3.5 |
| Bath temperature | 20–40° C. |
| Current density | 0.1–0.5 A/dm$^2$ |
| Time | 10–60 sec. |
| Anode | lead, Pt-Ti or stainless steel plate |

The amount of the chromium oxide to be deposited may not exceed 50 μg/dm$^2$ as chromium and is preferably in the range of 15–30 μg/dm$^2$. A chromium amount exceeding 30 μg/dm$^2$ improves the anticorrosive property but reduces the etchability.

As a useful anticorrosive technique, the present applicant has proposed and attained many successful results from the formation of a mixed coating film of zinc and/or zinc oxide and chromium oxide through electrolytic zinc-chromium treatment (Pat. App. Pub. No. 7077/1983). Pat. App. Public Disclosure No. 294490/1990 discloses a method which comprises forming a chromium oxide film by dip chromate treatment and then forming a mixed film of zinc and/or zinc oxide and chromium oxide by electrolytic zinc-chromium treatment. The latter is aimed at preventing the development of black spots upon long-term exposure to hot and humid environments.

Finally, in case of necessity, a silane treatment is performed whereby the anticorrosive layer is coated with a silane coupling agent primarily for the purpose of increasing the adhesion between the copper foil and the resin base. The coating may be applied in whatever manner desirable, e.g., by spraying a solution of a silane coupling agent, application by means of a coater, immersion, or casting. For instance, Pat. App. Pub. 15654/1985 teaches improving the adhesion between the copper foil and the resin base by treating the matted side of the foil first with chromate and then with a silane coupling agent. For more details, refer to the cited publication.

The copper foil thus coated on the matted side is further coated with an adhesive, following any necessary treatment of the shiny side, and pressed against a resin base under heating to form a coppered laminate for printed circuits. The laminate is subsequently processed as desired for service as printed circuit boards. The shiny side is treated according to the specific level of properties required for that side. The treatment is suitably chosen from among various chemical conversion treatments including chromate treatment, organic agent treatment that depends on a chelating reaction with copper, and coating with a metal or alloy less noble than copper.

Additionally, when necessary, the laminate may be annealed to enhance the ductility of the copper foil.

Experiments have revealed that the copper foils roughened in a copper electrolytic bath containing chromium ion tungsten ion or both in accordance with the present invention are uniformly treated and exhibit excellent substrate properties without unevenness. Specifically, laminated boards of copper foil and glass fabric-backed epoxy resin base possess good adhesiveness and heat resistance. Since dendritic growth is inhibited and rounded copper electrodeposits are formed, the laminates show high bond strength and the boards after etching have favorable properties without any problem of electric characteristic deterioration or dusting.

EXAMPLES

Examples of the present invention and comparative examples are given below.

Example 1

Figure 2:
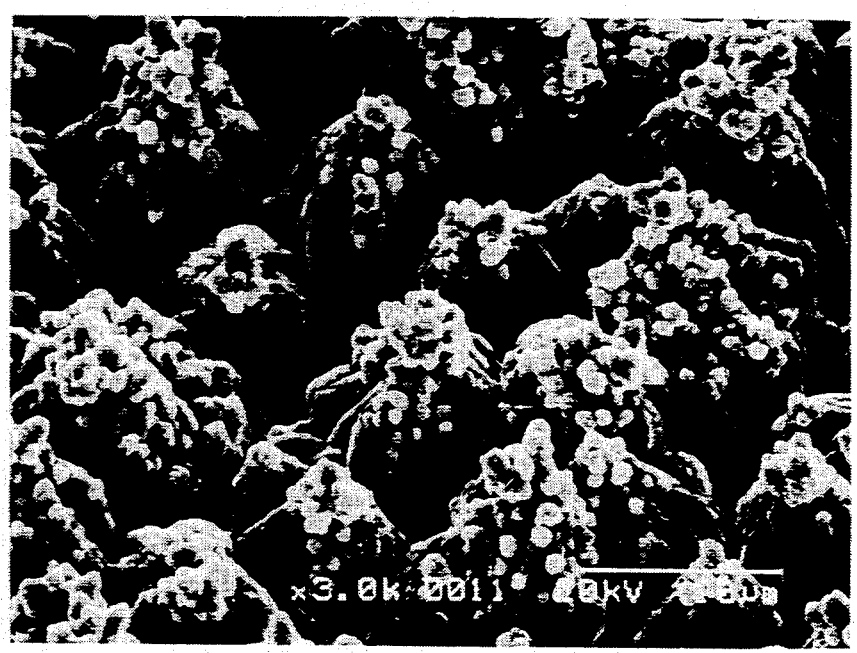
FIG. 2 is an electron micrograph the protuberant structure of the roughened surface of copper foil obtained in Example 1 (magnification: ×3000)

An aqueous solution containing 100 g each of copper sulfate ($5H_2O$) and sulfuric acid and 1 g of chromic anhydride (VI) per liter was used as an electrolytic bath at 30° C. In this bath, the side of a 70 μm-thick electrolytic copper foil to be bonded was plated at a current density of 20 A/dm² for 10 seconds. An analysis of the copper foil thus obtained showed that the chromium content in the entire foil was about 1 ppm. (The Cr content in the protuberant copper electrodeposits was about 0.01 wt %.) An electron micrograph showing how protuberant copper electrodeposits were formed on the roughened side of the copper foil is given in FIG. 2. The foil was bonded to a glass fabric-epoxy resin base with the application of heat and pressure to make a coppered laminate board. The board was tested for peel strength and dusting properties. The results are given in Table 1.

Example 2

Figure 3:
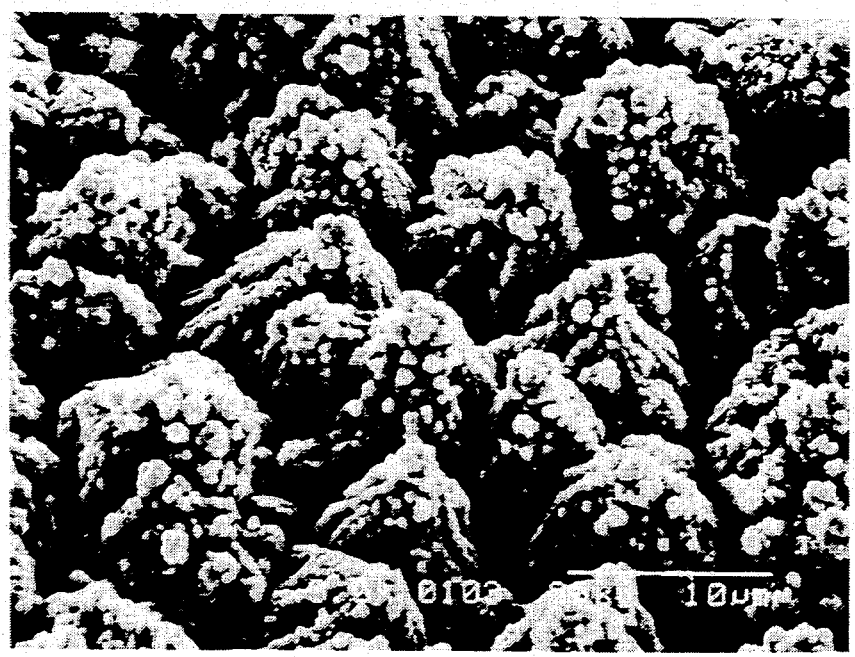
FIG. 3 is an electron micrograph of the protuberant structure of the roughened copper foil surface obtained in Example 2 (×3000)

A 70 μm-thick electrolytic copper foil was plated on the side to be bonded using an electrolytic bath which is an aqueous solution containing 100 g/l copper sulfate ($5H_2O$), 100 g/l sulfuric acid, and 0.02 g/l sodium tungstate ($2H_2O$) at 30° C. and at a current density of 10 A/dm² for 20 seconds. Upon analysis this copper foil was found to contain about 1 ppm tungsten in the total foil amount (the W content in the protuberant copper electrodeposits being about 0.01 wt %). FIG. 3 is an electron micrograph showing the protuberant copper electrodeposits formed on the roughened side of the copper foil. The foil was bonded to a glass fabric-epoxy resin base with heat and pressure, and the laminate thus coppered was tested for peel strength and dusting properties. Table 1 shows the results.

Example 3

Figure 4:
FIG. 4 is an electron micrograph of the protuberant structure of the roughened copper foil surface obtained in Example 3 (×3000)

An aqueous solution containing 100 g/l copper sulfate ($5H_2O$), 100 g/l sulfuric acid, 0.1 g/l chromic anhydride(VI), and 0.01 g/l sodium tungstate ($2H_2O$) was used as an electrolytic bath at 30° C. An electrolytic copper foil 70 μm thick was plated on the side to be bonded, using the bath at a current density of 20 A/dm² for 10 seconds. The copper foil so obtained was analyzed and found to contain about 0.1 ppm each of chromium and tungsten (the Cr and W contents in the protuberant copper electrodeposits being approximately 0.001 and 0.002 wt %, respectively). FIG. 4 is an electron micrograph showing how protuberant copper electrodeposits were formed on the matted side of the copper foil thus obtained. The foil was bonded to a glass fabric-epoxy resin base with heat and pressure and the laminate obtained was tested for peel strength and dusting tendency. The results are given in Table 1.

Comparative Example 1

Figure 5:
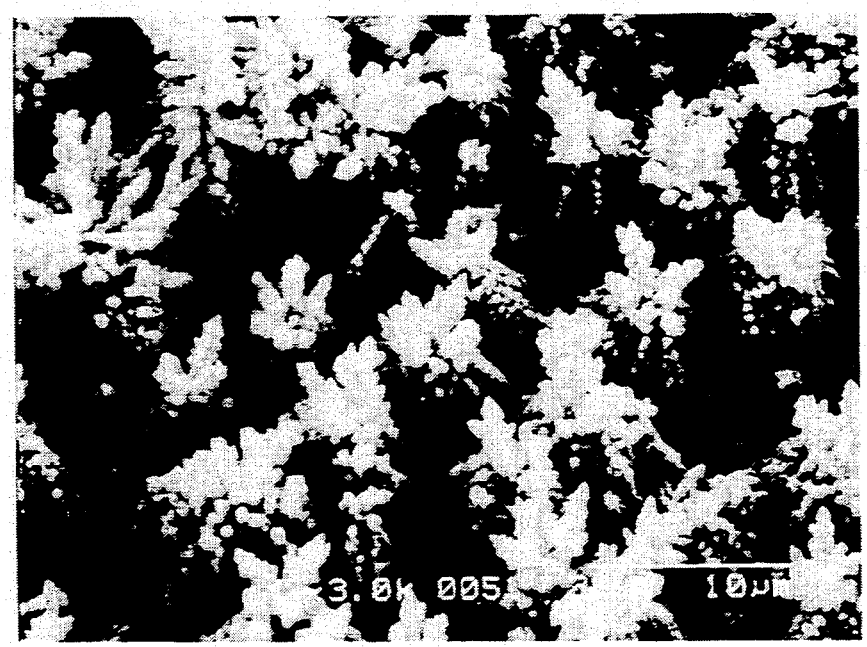
FIG. 5 is an electron micrograph of the protuberant structure of the roughened copper foil surface obtained in Comparative Example 1 (×3000)

As an example free from additive, an aqueous solution containing 100 g each of copper sulfate ($5H_2O$) and sulfuric acid per liter was prepared as an electrolytic bath at 30° C. Using this bath a 70 μm-thick electrolytic copper foil was plated on the side to be bonded, at a current density of 20 A/dm² for 10 seconds. An electron micrograph of protuberant copper electrodeposits formed on the matted side of the copper foil is shown in FIG. 5. The foil was used in pressing to a glass fabric-epoxy resin base with heat and pressure to make a laminate. The peel strength and dusting properties of the laminate were determined. The results are shown in Table 1. In FIG. 5 are observed dendritic electrodeposits.

Comparative Example 2

Figure 6:
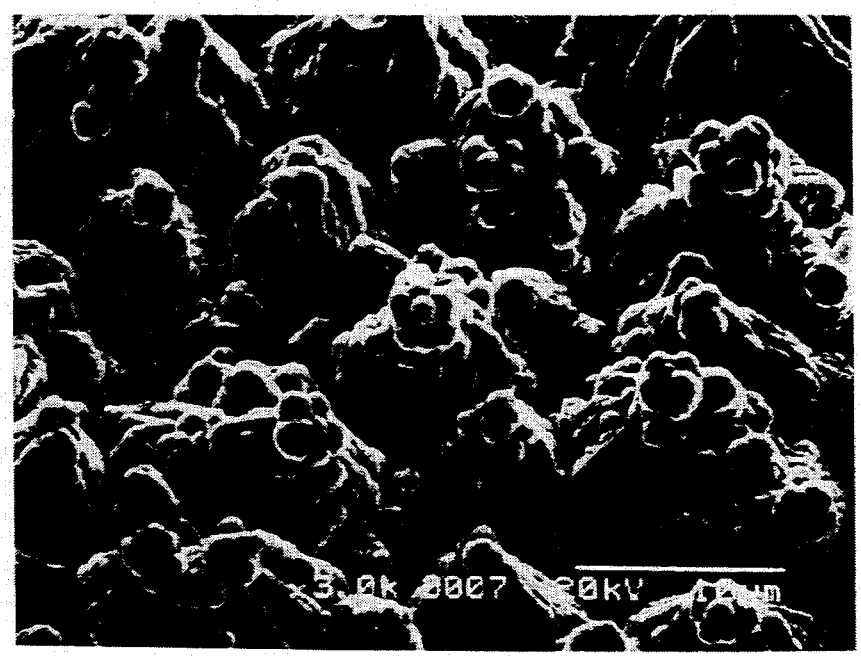
FIG. 6 is an electron micrograph of the protuberant structure of the roughened copper foil surface obtained in Comparative Example 2 (×3000).

As an example containing arsenic as usual, an aqueous solution containing 100 g copper sulfate ($5H_2O$) and 100 g sulfuric acid and 3 g arsenic acid per liter was used as an electrolytic bath at 30° C. With this bath a 70 μm-thick electrolytic copper foil was plated on the side to be bonded at a current density of 20 A/dm² for 10 seconds. The thus obtained copper foil upon analysis showed an arsenic content of about 200 ppm in the entire foil amount (the As content in the protuberant copper electrodeposits being about 1.2 wt %). An electron micrograph of the protuberant copper electrodeposits formed on the roughened side of the copper foil is shown in FIG. 6. A laminate was fabricated from the foil bonded with heat and pressure to a glass fabric-epoxy resin base, and its peel strength and dusting tendency were determined. The results are given in Table 1.

TABLE 1

| | Copper foil properties | | |
|---|---|---|---|
| | Element(s) added to acidic copper electrolytic solution | Peel strength (kg/cm) | Dusting |
| Example 1 | Cr | 2.41 | no |
| Example 2 | W | 2.42 | no |
| Example 3 | Cr, W | 2.39 | no |
| Comp.Ex.1 | none | 2.06 | yes |
| Comp.Ex.2 | As | 2.37 | no |

Advantage of the Invention

The copper foil roughened by the use of a copper electrolytic bath containing chromium or tungsten or both in conformity with the present invention is uniformly treated and, without unevenness, exhibits outstanding substrate properties. Laminated boards of the copper foil and a glass fabric-epoxy resin base possess good adhesiveness and heat resistance. Since dendritic growth is inhibited and rounded copper electrodeposits are formed, the laminates show enhanced bond strength and the boards after etching presents no problem of electric characteristic deterioration or dusting.

What is claimed is:

1. A copper foil for printed circuits comprising a copper foil having a roughened layer formed on the side of the foil to be bonded to a base, said roughened layer consisting of a number of protuberant copper electrodeposits containing chromium, tungsten or both, in an amount effective to form rounded protuberances in said roughened layer and inhibit the growth of dendrites therein.

2. A copper foil for printed circuits comprising a copper foil having a roughened layer formed on the side of the foil to be bonded to a base, said roughened layer consisting of a number of protuberant copper electrodeposits containing chromium, tungsten or both, in an amount effective to form rounded protuberances in said roughened layer and inhibit the growth of dendrites therein, a copper plating layer covering said roughened layer, and a treatment layer covering said copper plating layer, said treatment layer being formed of either a metal selected from the group consisting of copper, chromium, nickel, iron, cobalt, and zinc, or an alloy of two or more such metals.

3. A copper foil for printed circuits comprising a copper foil having a roughened layer formed on the side of the foil to be bonded to a base, said roughened layer consisting of a number of protuberant copper electrodeposits containing chromium, tungsten or both, in an amount effective to form rounded protuberances in said roughened layer and inhibit the growth of dendrites therein, a copper plating layer covering said roughened layer, a treatment layer covering said copper plating layer, said treatment layer being formed of either a metal selected from the group consisting of copper, chromium, nickel, iron, cobalt, and zinc, or an alloy of two or more such metals, and an anticorrosive layer further coating said treatment layer.

4. A process for producing a copper foil for printed circuits which comprises electrolyzing a copper foil as a cathode in an acidic copper electrolytic bath at a current density around the critical, thereby forming a roughened layer consisting of a number of protuberant copper electrodeposits formed on the side of the copper foil to be bonded to a base, said electrolytic bath containing from 0.001 to 5 grams per liter of chromium ions, tungsten ions or both.

5. A process according to claim 4 wherein the roughened layer is coated with a copper plating layer and then electrolytically overcoated with a treatment layer formed of either a metal selected from the group consisting of copper, chromium, nickel, iron, cobalt, and zinc, or an alloy of two or more such metals.

6. A process according to claim 5, wherein the treatment layer in anti-corrosively treated.

7. A process according to claim 4, said bath containing from 0.001 to 5 gram per liter of chromium ion, tungsten ion or both.

8. A process according to claim 7, said bath containing 0.01 to 1 gram per liter of chromium ion, tungsten ion or both.

9. A copper foil for printed circuits comprising a copper foil and a roughened layer formed on the side of the foil to be bonded to a base, said roughened layer consisting of a number of protuberant copper electrodeposits containing chromium, tungsten or both wherein said electrodeposits are obtained by electrodeposition from a bath containing from about 0.001 to about 5 grams per liter of chromium ion, tungsten ion or both.

10. A copper foil according to claim 9, wherein said electrodeposits are obtained by electrodeposition from a bath containing from about 0.01 to about 1 gram per liter of chromium ion, tungsten ion or both.

11. A copper foil for printed circuits comprising:
   (i) a copper foil having a roughened layer formed on the side of the foil to be bonded to a base, said roughened layer consisting of a number of protuberant copper electrodeposits containing chromium or tungsten, or both, wherein said electrodeposits are obtained by electrodeposition from a bath containing from about 0.001 to about 5 grams per liter of chromium ion, tungsten ion or both,
   (ii) a copper plating layer covering said roughened layer, and
   (iii) a treatment layer covering said copper plating layer, said treatment layer being formed of either a metal selected from the group consisting of copper, chromium, nickel, iron, cobalt, and zinc, or an alloy of two or more such metals.

12. A copper foil according to claim 11, wherein said electrodeposits are obtained by electrodeposition from a bath containing from about 0.01 to about 1 gram per liter of chromium ion, tungsten ion or both.

13. A copper foil for printed circuits comprising:
   (i) a copper foil having a roughened layer formed on the side of the foil to be bonded to a base, said roughened layer consisting of a number of protuberant copper electrodeposits containing chromium or tungsten, or both, wherein said electrodeposits are obtained by electrodeposition from a bath containing from about 0.001 to about 5 grams per liter of chromium ion, tungsten ion or both,
   (ii) a copper plating layer covering said roughened layer,
   (iii) a treatment layer covering said copper plating layer, said treatment layer being formed of either a metal selected from the group consisting of copper, chromium, nickel, iron, cobalt, and zinc, or an alloy of two or more such metals, and
   (iv) an anticorrosive layer further coating said treatment layer.

14. A copper foil according to claim 13, wherein said electrodeposits are obtained by electrodeposition from a bath containing from about 0.01 to about 1 gram per liter of chromium ion, tungsten ion or both.

* * * * *